(12) United States Patent
Zayer (10) Patent No.: US 10,186,829 B2
(45) Date of Patent: Jan. 22, 2019

(54) COMPACT LASER SOURCE WITH WAVELENGTH STABILIZED OUTPUT

(71) Applicant: II-VI Incorporated, Saxonburg, PA (US)

(72) Inventor: Nadhum Kadhum Zayer, Devon (GB)

(73) Assignee: II-VI Incorporated, Saxonburg, PA (US)

(*) Notice: Subject to any disclaimer, the term of this patent is extended or adjusted under 35 U.S.C. 154(b) by 12 days.

(21) Appl. No.: 15/492,364

(22) Filed: Apr. 20, 2017

(65) Prior Publication Data

US 2017/0331246 A1 Nov. 16, 2017

Related U.S. Application Data

(60) Provisional application No. 62/334,000, filed on May 10, 2016.

(51) Int. Cl.
| | | |
|---|---|---|
| H01S 3/13 | (2006.01) | |
| *H01S 3/108* | (2006.01) | |
| *H01S 5/0687* | (2006.01) | |
| *G02B 6/02* | (2006.01) | |
| G02B 6/42 | (2006.01) | |

(52) U.S. Cl.
CPC ............ *H01S 3/108* (2013.01); *G02B 6/0208* (2013.01); *H01S 5/0687* (2013.01); *G02B 6/4201* (2013.01); *G02B 6/424* (2013.01); *G02B 6/4248* (2013.01); *G02B 6/4251* (2013.01); *G02B 6/4256* (2013.01); *G02B 6/4257* (2013.01); *G02B 6/4269* (2013.01); *G02B 6/4277* (2013.01)

(58) Field of Classification Search
CPC ...... H01S 3/108; H01S 5/02248; H01S 5/005; H01S 5/0687; H01S 3/06704; H01S 5/02284; H01S 5/02252; G02B 6/0208; G02B 6/4204; G02B 6/4268; G02B 6/4248; B23K 1/0008; H01L 2224/48091; H01L 2224/48247
USPC .......................................................... 372/32
See application file for complete search history.

(56) References Cited

U.S. PATENT DOCUMENTS

| | | | |
|---|---|---|---|
| 5,305,335 A * | 4/1994 | Ball ........................ | H01S 3/067 372/102 |
| 5,563,732 A | 10/1996 | Erdogan et al. | |
| 5,699,377 A * | 12/1997 | Pan ...................... | G02B 6/0218 372/102 |
| 5,870,417 A * | 2/1999 | Verdiell ............. | G02B 6/12007 372/102 |
| 5,995,692 A * | 11/1999 | Hamakawa .......... | G02B 6/4207 372/102 |

(Continued)

*Primary Examiner* — Vu A Vu
(74) *Attorney, Agent, or Firm* — Wendy W. Koba (57) ABSTRACT

A compact, wavelength-stabilized laser source is provided by utilizing a specialty gain element (i.e., formed to include a curved waveguide topology), where a separate wavelength stabilization component (for example, a fiber Bragg grating (FBG)) is used one of the mirrors for the laser cavity. That is, the FBG takes the place of the physical "front facet" of the gain element, and functions to define the laser cavity in the first instance, while also utilizing the grating structure to impart the desired wavelength stability to the output from the packaged laser source. As a result, the FBG is disposed within the same package used to house the gain element and provides a wavelength-stabilized laser source in a compact form.

7 Claims, 6 Drawing Sheets

(56) References Cited

U.S. PATENT DOCUMENTS

| | | | |
|---|---|---|---|
| 6,091,755 A * | 7/2000 | Sanders | H01S 5/10 |
| | | | 372/102 |
| 6,769,819 B2 * | 8/2004 | Tanaka | G02B 6/4226 |
| | | | 385/92 |
| 6,819,702 B2 | 11/2004 | Sverdlov et al. | |
| 7,245,419 B2 | 7/2007 | Brennan, III et al. | |
| 7,664,156 B2 | 2/2010 | Yamazaki | |
| 8,526,103 B2 | 9/2013 | Mohrdiek et al. | |
| 2005/0063441 A1 | 3/2005 | Brown | |
| 2006/0209912 A1 | 9/2006 | Ningyi et al. | |
| 2009/0279577 A1 | 11/2009 | McCarthy | |
| 2009/0310634 A1 | 12/2009 | Mohrdiek et al. | |
| 2014/0064306 A1 | 3/2014 | Yoon et al. | |
| 2014/0071455 A1 | 3/2014 | Dimashkie | |
| 2014/0276686 A1 | 9/2014 | Chunbai et al. | |
| 2015/0093069 A1 | 4/2015 | Nakamura | |
| 2015/0131690 A1 * | 5/2015 | Connolly | H01S 5/12 |
| | | | 372/50.11 |

* cited by examiner

COMPACT LASER SOURCE WITH WAVELENGTH STABILIZED OUTPUT

CROSS-REFERENCE TO RELATED APPLICATIONS

This application claims the benefit of U.S. Provisional Application Ser. No. 62/334,000, filed May 10, 2016 and herein incorporated by reference.

TECHNICAL FIELD

The present invention relates to laser sources and, more particularly, to incorporating an output wavelength stabilization component within the same package as the laser gain material.

BACKGROUND OF THE INVENTION

There are various applications where it is desirable to maintain a stable output wavelength from a laser source. For example, a major requirement for lasers installed in gyroscope systems is to be able to generate a consistent wavelength over a vast temperature range (e.g., −60° C. to +90° C.). Optical amplifiers also require a stable laser source, in this case for providing a stable "pump" input to the amplifier. In many embodiments, a pump input at a wavelength of 980 nm is used to provide amplification within an erbium-doped optical fiber. If the output wavelength of the pump starts to drift by even a few nanometers (which may easily happen in the presence of changes in ambient temperature and/or input drive current), the gain and output power from the doped fiber is reduced and the efficiency of the optical amplifier is compromised.

Conventional approaches of "wavelength locking" a laser source typically utilize a fiber Bragg grating (FBG) inscribed within the optical output fiber coupled to the packaged laser source. The FBG functions as a highly-selective wavelength filter, further ensuring that only the desired 980 nm wavelength beam continues to propagate along the output path. As will be explained below, this FBG needs to be positioned well beyond the output from the laser source (on the order of about 1-2 meters), so as to properly interact with the front facet of the laser diode to create a reflective, external cavity that functions to further stabilize the wavelength of the laser output light.

Well-known processes for creating an FBG in an optical fiber require significant handling of the fiber itself. For example, the portion of the fiber within which the grating is to be located must be processed ("stripped") to remove outer jacket and coating layers, exposing the bare fiber where the grating is formed. Next, the stripped portion of the fiber is typically exposed to a UV source that illuminates the fiber with interfering beams in a manner that modifies the refractive index profile of the core region of the fiber as a function of the beam interference, forming the grating. Once the grating is formed, new layers of jacket and coating material need to be re-applied along the stripped area of the fiber to protect the grating.

Throughout these and other processes, the fiber exiting the laser diode package is subjected to an extensive amount of handling, which may lead to further degrading the long-term reliability/strength of the fiber (especially in situations where the fiber needs to be tightly coiled to comply with packaging requirements). The degradation in the long-term reliability is due, at least in part, to defects introduced in the fiber during the process of creating the grating structure.

Conventional methods of accommodating the presence of these defects include the use of special packaging constraints that maintain the portion of the fiber containing the grating in a straight line so that any bend-induced defects are avoided. Alternatively, special packaging can be created that maintains a large bend radius within the section of fiber containing the grating. Given the lengths of fiber associated with these systems (typically, at least one meter of fiber; in most cases in the range of 1-2 m) the demands on "special packaging" may be greater than economically feasible for most applications. Moreover, there is an increasing demand to comply with "small form factor" packaging requirements for all optical components, where these requirements do not easily accommodate the use of relatively long lengths of fiber or large radius fiber coils, as common in the prior art, to provide output wavelength stability from laser sources.

SUMMARY OF THE INVENTION

Various ones of the problems associated with providing laser source wavelength stability in an acceptable "small form factor" manner are addressed by the present invention, which relates to laser sources and, more particularly, to incorporating an output wavelength stabilization component within the same package as the laser gain material itself.

In accordance with one or more embodiments of the present invention, a wavelength stabilization component (for example, a fiber Bragg grating (FBG)) is used as a partially reflective mirror element, forming a laser cavity with a specialized gain element having a reflective rear facet. That is, the FBG takes the place of the physical "front facet" of the gain element, and functions to define the laser cavity in the first instance, while also utilizing the grating structure to impart the desired wavelength stability to the output from the packaged laser source.

One exemplary embodiment of the present invention takes the form of a compact wavelength-stabilized laser source comprising a specialty gain element including a curved optical waveguide configured such that a front facet is non-parallel with a rear facet. The rear facet defines a first mirror of a laser cavity along an optical axis through the curved optical waveguide, with the specialty gain element energized to generate optical radiation. The compact laser source also includes a partially-reflective wavelength stabilization component disposed in relatively close proximity to the front facet of the specialty semiconductor gain element and positioned in optical alignment with the rear facet. The wavelength stabilization component is utilized as the second mirror of the laser cavity, thus providing lasing while also controlling the stability of the lasing output wavelength.

Another exemplary embodiment is defined as a small form-factor, wavelength-stabilized packaged laser comprising a housing formed in compliance with small form-factor requirements, a submount disposed within and attached to the housing, a specialty gain element disposed on the submount (the specialty gain element including a curved optical waveguide configured such that a front facet is non-parallel with a rear facet, the rear facet defining a first mirror of a laser cavity along an optical axis through the curved optical waveguide). Also incorporated within the housing of the packaged laser is a partially-reflective wavelength stabilization component, which is disposed in close proximity to the front facet of the specialty semiconductor gain element and positioned in optical alignment with the rear facet to form a second mirror of the laser cavity. The stabilization component also functions as a wavelength filter to stabilize the output wavelength of the generated optical radiation. An optical output fiber is disposed adjacent to the specialty gain element and receives the generated wavelength-stabilized laser output, where the output fiber is disposed to exit through a sidewall of the packaged laser housing.

Other and further embodiments of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
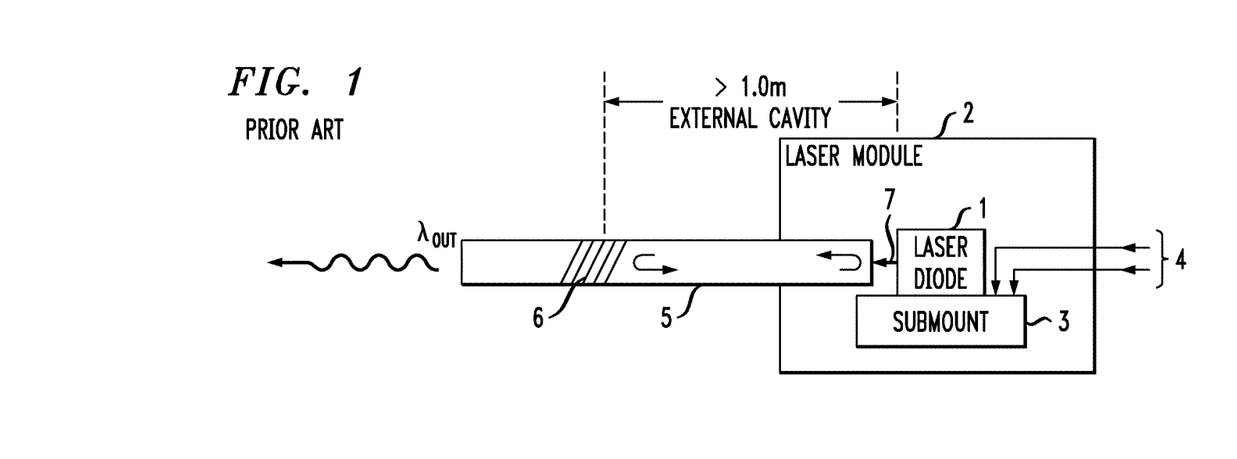
FIG. 1 contains a simplified diagram of a prior art wavelength stabilization configuration.

FIG. 1 contains a simplified diagram of a prior art laser source configuration, utilizing a laser diode 1 to generate an optical output beam at a desired wavelength (for example, 980 nm when the source is used as pump in an optical amplifier). Laser diode 1 is housed within a laser module package 2, where laser diode 1 is itself disposed on a submount 3 included within package 2. A pair of electrical contacts 4 extends into package 2 and is used to provide a bias current to energize laser diode 1. Laser diode 1 is formed to include reflective facets 7 and 8, where in the presence of the applied bias current, a laser cavity is formed between facets 7 and 8. The optical output signal from front facet 7 of laser diode 1 is coupled into an output transmission fiber 5, which exits through package 2. In a basic configuration, the optical output signal thereafter propagates along fiber 5 and is used in a specific application, such as a source for gyroscope or a pump wave for an optical amplifier. Without any other modification or processing, the output wavelength from laser diode 1 may drift over time, as a function of the ambient temperature of laser diode 1, changes in the input signal applied at electrical contacts 4, etc.

To stabilize this tendency to drift, a fiber Bragg grating (FBG) 6 is created within transmission fiber 5. FBG 6 functions as a partially reflective device, providing a few percent of reflected radiation as feedback to front facet 7 of laser diode 1, "locking" the output at a specific wavelength associated with the filtering properties of FBG 6. As shown in FIG. 1, the resultant configuration forms a relatively long external cavity extending between FBG 6 and front facet 7. While useful, the need to utilize an external cavity having a length of at least one meter is impractical in most situations, and the increasing demands of small form factor packaging provides further impetus to find another solution.

In accordance with the present invention, a specialty type of semiconductor gain element is utilized that allows for a separate wavelength stabilization component to be used as a mirror of the laser cavity (such as reflectivity provided by a Bragg grating) and thus provide a wavelength-stable laser source that can be completely contained within a small form factor package, creating a compact laser source with output wavelength stability. As will be described in detail below, the partially reflective, wavelength stabilization component may be positioned in relatively close proximity to the specialty type of semiconductor gain element (e.g., less than about 4 mm or so from a front facet) and form a resonant cavity with the reflective back facet of the semiconductor gain element. This close positioning therefore allows for the Bragg grating to be incorporated within the same package as the gain element (thus providing a compact laser source), performing the dual roles of "cavity mirror" for the laser, and a wavelength-selective filter to maintain a stable output wavelength from the laser source.

Figure 2:
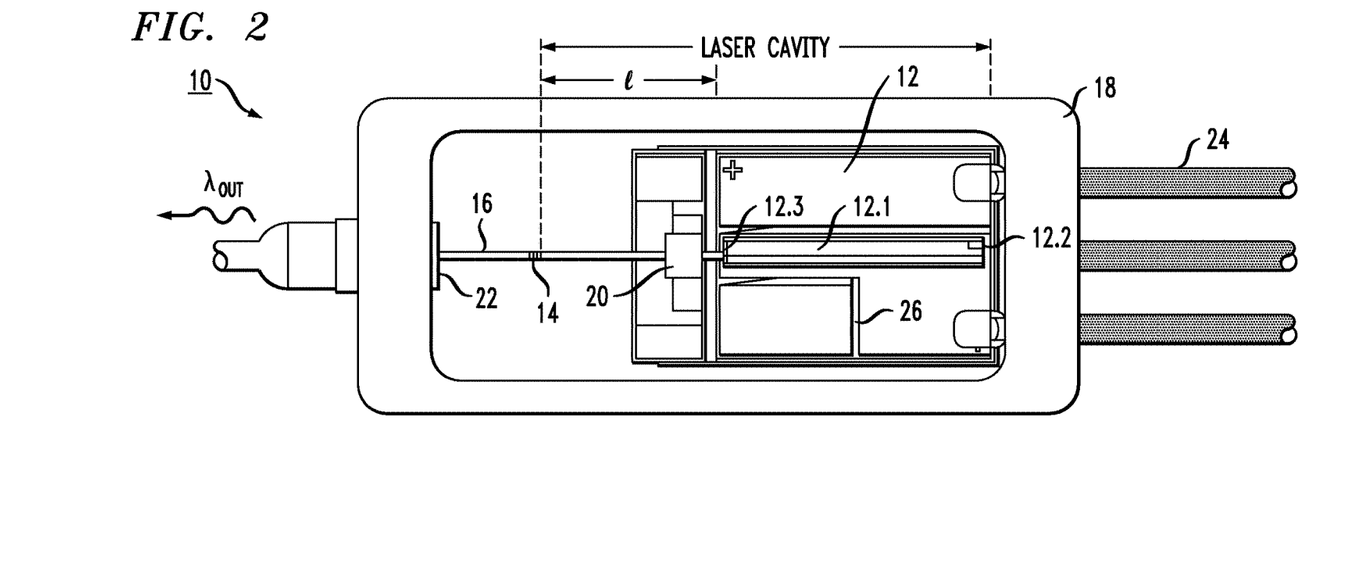
FIG. 2 is a top view of an exemplary wavelength-stabilized laser source formed in accordance with the present invention.
Figure 3:
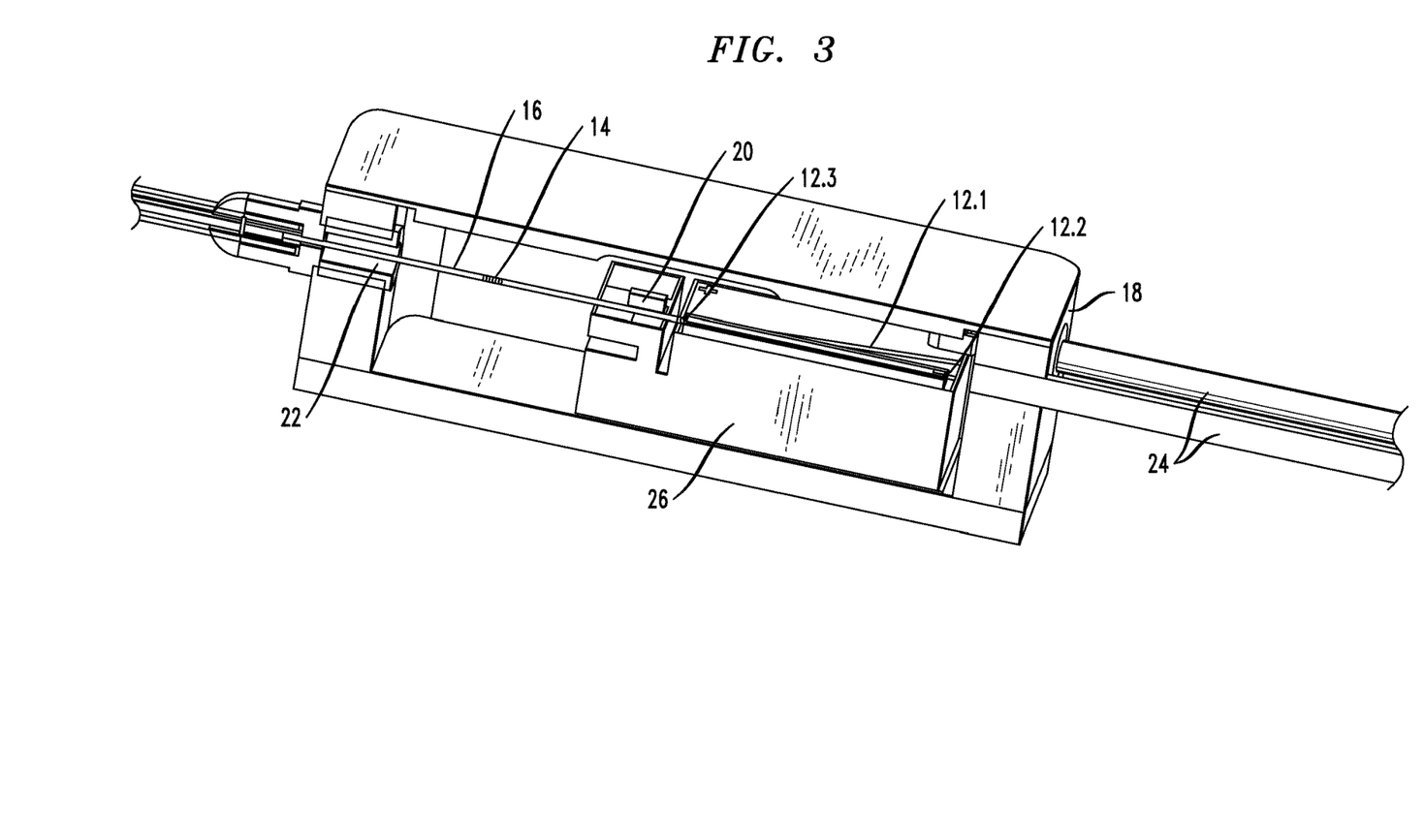
FIG. 3 is an isometric view of various components contained within the exemplary embodiment of FIG. 2.

FIG. 2 is a top view of a compact laser source 10 formed in accordance with an exemplary embodiment of the present, where compact laser source 10 is configured to provide the desired degree of wavelength stability for the output optical beam while not exceeding the very small form factor requirements for newer systems. FIG. 3 is a cut-away isometric view of compact laser source 10.

Figure 4:
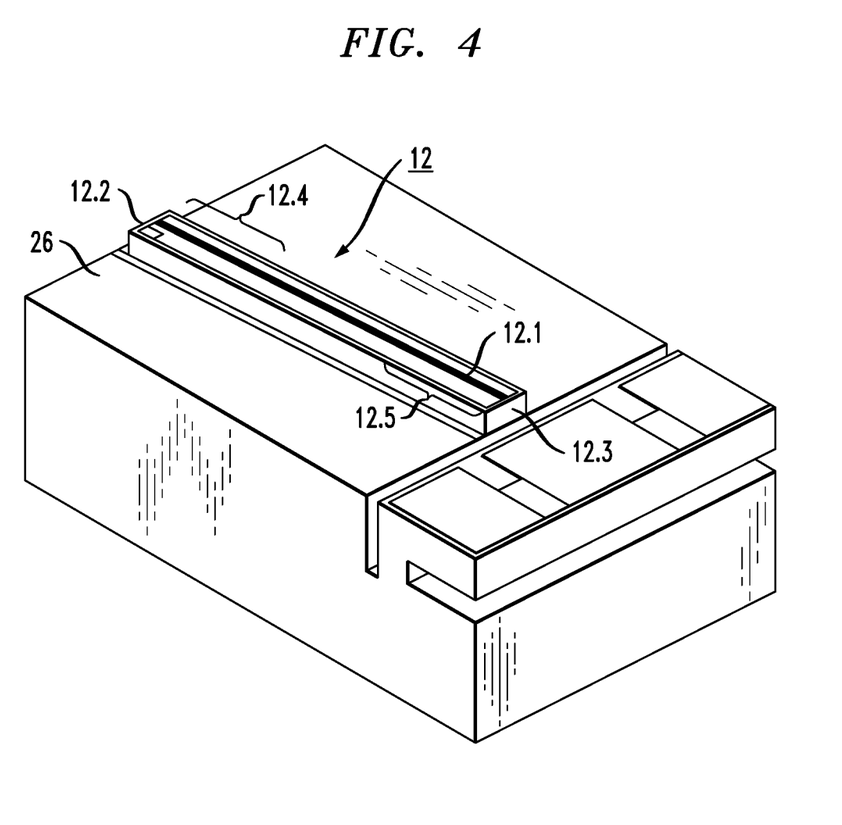
FIG. 4 is a detailed illustration of an exemplary specialty gain element, including a curved waveguide, that may be used in a wavelength-stabilized laser source formed in accordance with the present invention.

In accordance with this embodiment of the present invention, compact laser source 10 includes a specialty semiconductor gain element 12 that is configured to exhibit somewhat of a curved topology between its front facet and its rear facet. An exemplary specialty semiconductor gain element 12 is shown in FIG. 4 as comprising an optical waveguide 12.1 having a rear facet 12.2 and a front facet 12.3. In most embodiments, rear facet 12.2 includes a highly reflective coating that may impart any suitable amount of reflectivity to generate feedback for laser emission. In one embodiment, the reflectivity of the coating on rear facet 12.2 may be greater than 95%. At least 1% reflectance is necessary to enable lasing. The coating on front facet 12.3 may impart any suitable amount of reflectivity. Although effective reflectivity of front facet 12.3 may be reduced by virtue of using a curved topology for waveguide 12.1, an AR coating may still be desired to be formed on the surface of front facet 12.3. With the utilization of a curved optical waveguide 12.1, the optical radiation exits front facet 12.3 at a slight angle with respect to its normal (while remaining parallel to the normal of rear facet 12.2).

Further with reference to FIGS. 2 and 3, in accordance with one or more embodiments of the present invention, a wavelength stabilization component 14 (here taking the form of an FBG) is used as both a mirror for the laser cavity and a filter to provide output wavelength stability. As shown, partially reflecting FBG 14 is formed within a section of optical fiber 16 and is advantageously contained within the same packaging 18 as that housing specialty gain element 12 so as to form a compact, wavelength-stabilized laser source. In particular, FBG 14 is disposed so as to be parallel with rear facet 12.2 of optical waveguide 12.1 formed within semiconductor gain element 12. Therefore, by controlling the orientation of partially reflecting FBG 14 with respect to rear facet 12.2, the combination of these two elements defines the resonant cavity required to provide a lasing output. Also shown in FIGS. 2 and 3 is a pair of electrical contacts 24 which extends through package housing 18 and contacts semiconductor gain element 12. Additionally, a submount 26 is illustrated in FIGS. 2-4, and is used to support specialty semiconductor gain element 12 at an appropriate height within the package (among other functions).

Figure 5:
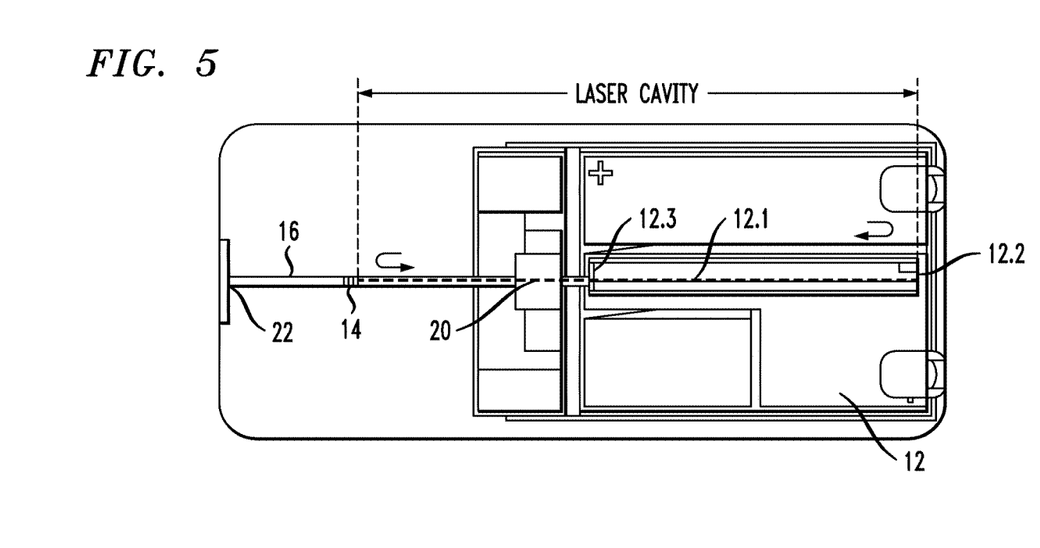
FIG. 5 is a diagram of the combination of the curved waveguide and fiber Bragg grating (FBG) used to create the resonant laser cavity.
Figure 6:
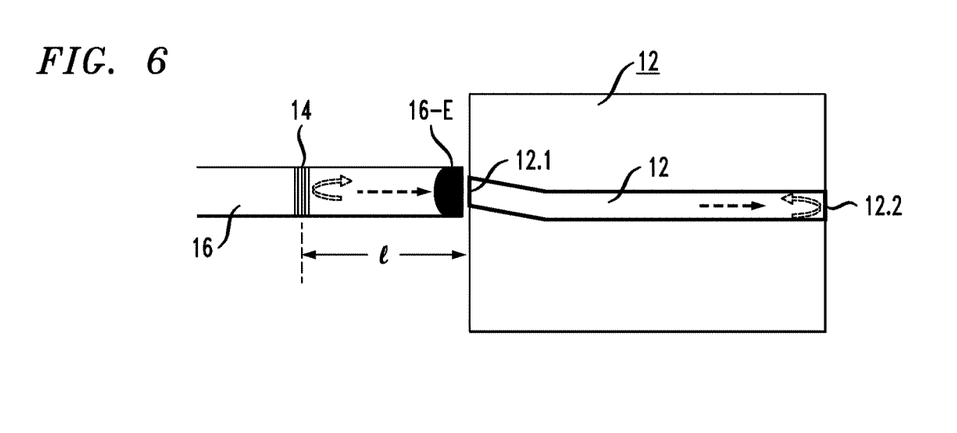
FIG. 6 is simplified view of the configuration of FIG. 5, showing the relatively close spacing between a front facet of the gain material and the FBG.

FIG. 5 illustrates a portion of compact laser source 10 of FIG. 2, in this case clearly showing the laser cavity formed between partially reflective FBG 14 and rear facet 12.2. FIG. 6 is a simplified block diagram showing the reflections of rays traveling within the laser cavity created by FBG 14 and rear facet 12.2. As clearly shown in FIGS. 5 and 6, FBG 14 may be positioned in relatively close proximity to front facet 12.3 of semiconductor gain element 12 (e.g., about 4 mm), allowing for both FBG 14 and semiconductor gain element 12 to be disposed within a relatively small package housing 18 (that is, a housing that meets the very small form factor requirements). FBG 14 is created within optical fiber 16 using processes well-known in the art, with a terminal portion of fiber 16 beyond FBG 14 then exiting package housing 18 as shown in FIGS. 2 and 3.

In some cases, FBG 14 may be formed as a chirped grating, which experiences changes in reflectivity as a function of wavelength. In particular, a chirped FBG provides a linear change in grating period, which broadens the reflected spectrum. In this case, the chirped grating may exhibit an output FWHM of more than 0.5 nm, resulting in multiple Fabry-Perot (FP) cavity modes within the FBG envelope. This is in contrast to a conventional, uniform FBG configuration, with an output FWHM of about 1.3 nm, where the output spectrum could alternate between a single mode and multiple FP modes. The use of a chirped FBG, with the assurance of multiple FP modes within the output FBG envelope significantly reduces the optical noise thereafter propagating along optical fiber 16. The use of a chirped grating is considered to be optional.

By virtue of utilizing a specialized semiconductor gain element in combination with an integrated FBG, the configuration of the present invention is able provide the desired degree of wavelength stability, while also easily accommodating the requirements of very small form factor systems, since the optical output fiber extending beyond the package is a conventional fiber (i.e., containing no optical filter components) and can be coiled in a very tight radius without incurring the bend-induced defects (which otherwise occurred in the presence of the prior art FBG 6 that was located external to the package). Indeed, the grating itself, being encased within package housing 18, is further protected from situations where the properties of the grating could be disturbed.

In a preferred embodiment of the present invention, the properties of the included grating may be even further improved by including a slight bend in the internal portion of fiber 16 disposed between a pair of fixing points 20, 22 that are used to attach optical fiber 16 to package housing 18 (see FIGS. 2 and 3). The included slight bend functions to somewhat neutralize stress which may appear along fiber 16 under a wide range of temperatures. For example, the center wavelength of FBG 14 is known to be sensitive to any stress/strain applied along the associated optical fiber (as associated with changing operation conditions). Therefore, the inclusion of the small bend functions to "absorb" this stress/strain, maintaining the center wavelength of FBG 14 at its desired value.

Figure 7:
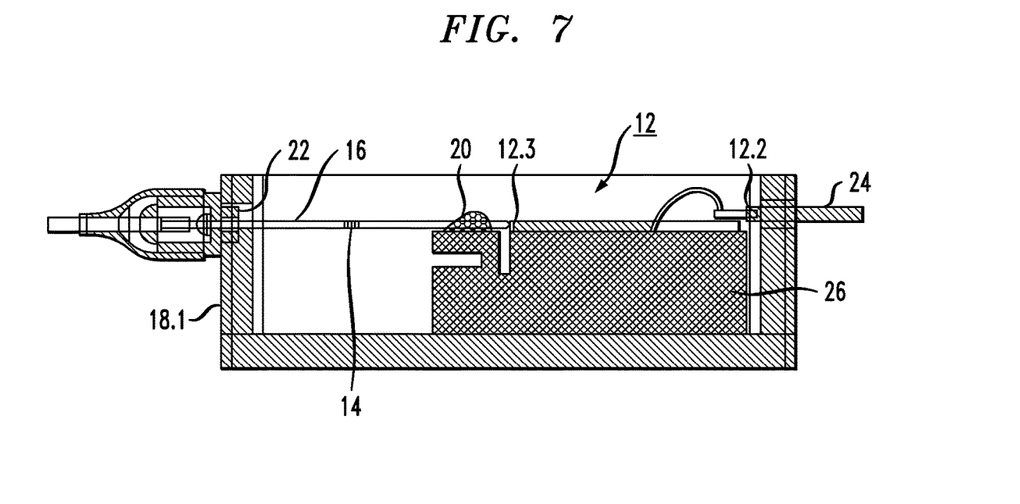
FIG. 7 is a side view of the configuration of FIG. 2.
Figure 8:
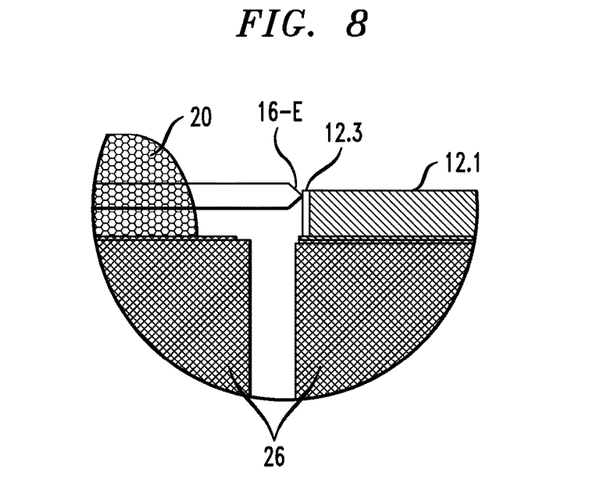
FIG. 8 is an enlarged view of a portion of the side view of FIG. 7.

FIG. 7 is a cut-away side view of compact laser source 10, and FIG. 8 is an enlarged view of a portion of the view of FIG. 7. The positioning of specialty semiconductor gain element 12 on submount 26 is clearly shown in FIG. 7, where the attachment of optical fiber 16 to submount 26 at fixing point 20 is also clearly shown. Second fixing point 22, included within a front wall 18.1 of housing 18 is evident as well. Again, the defined laser cavity is illustrated as extending between partially reflecting FBG 14 and rear facet 12.2 of optical waveguide 12.1, thus allowing for the wavelength stabilization properties of the FBG to be included within the same package as the lasing arrangement, resulting in the formation of a compact laser source.

In one exemplary configuration of this FBG-based embodiment of the present invention, an endface 16-E of optical fiber 16 may be lensed, as shown in the enlarged view of FIG. 8 (as well as FIG. 6), to improve the coupling efficiency between optical waveguide 12.1 and optical fiber 16.

As mentioned above, FBG 14 is only one type of partially reflective wavelength stabilization component that may be used as a laser cavity mirror with a specialty gain element in accordance with the present invention. Various other types of fiber-based or discrete components may used to provide the reflectivity and filtering properties necessary to function as both a partially reflective mirror and output wavelength stabilizer.

Figure 9:
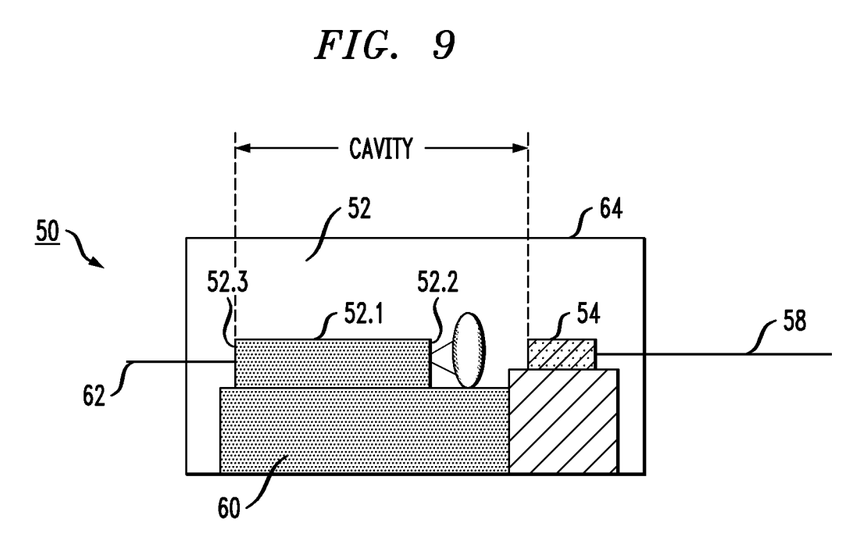
FIG. 9 is a diagram of an alternative embodiment of the present invention, in this case using discrete, bulk optic device (e.g., a volume Bragg grating (VBG)) as a wavelength stabilization component within the package used to house the optical gain element.

In particular, FIG. 9 contains a simplified diagram of an alternative embodiment of the present invention, where in this case a volume Bragg grating (VBG) is utilizes as the laser cavity mirror/wavelength selective component in accordance with the present invention. That is, a VBG may be disposed within the same package as a specialty (curved) semiconductor gain element and provide a stabilized laser source that may be housed within a preferred small form factor package. In particular, FIG. 9 is a side view of an exemplary laser source 50, including a specialty semiconductor gain element 52 (including a curved optical waveguide 52.1) and a VBG 54. As is known in the art, VBG 54 comprises a grating structure (similar to that described above in association with FBG 14), where in this case the grating structure takes the form of a discrete optical component; that is, a grating structure created within a cube (more particularly, a parallelepiped) of transparent material. For this particular embodiment, a lens 56 is utilized to collimate the optical radiation exiting front facet 52.2 of optical waveguide 52.1

As with the embodiment described above, optical waveguide 52.1 is formed as a curved structure such that front facet 52.2 is slightly non-parallel with rear facet 52.3. Partially reflective VBG 54 is disposed to be parallel with rear facet 52.3 and, therefore, forms a resonant cavity in combination of rear facet 52.3. VBG 54, as a wavelength selective component, also functions to stabilize the output wavelength from laser source 50 (i.e., functions as a wavelength-selective filter). An optical fiber 58 is shown in the embodiment of FIG. 9 as coupled to an output endface of VBG 54, and supports the propagation of the wavelength-stabilized optical output from laser source 50. Also shown in FIG. 9 is a submount 60 used to support semiconductor gain element 52, lens 56 and VBG 54. A pair of electrical contacts 62 is disposed to pass through housing 64 and provide the drive current to semiconductor gain element 52.

Figure 10:
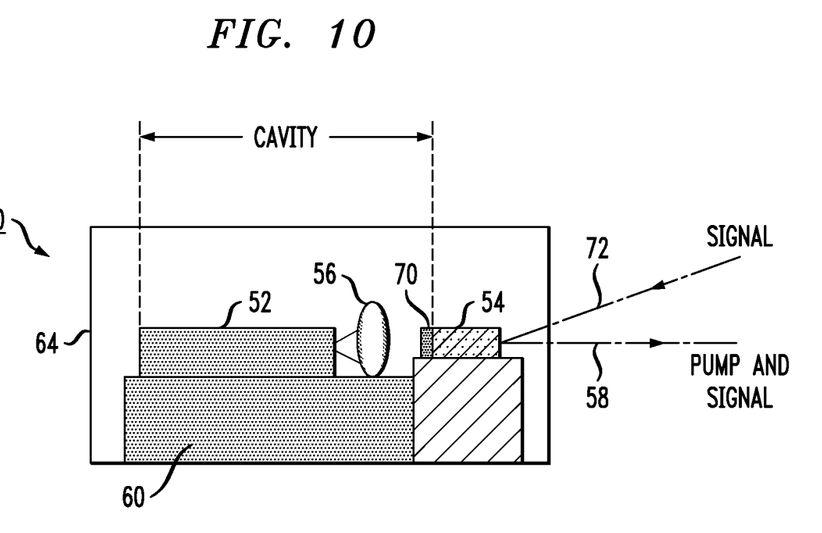
FIG. 10 illustrates another configuration of the alternative embodiment of FIG. 9, in this case taking the form of an optical amplifier component for introducing both an incoming optical signal and wavelength-stabilized pump beam onto a common optical output fiber.

FIG. 10 illustrates an alternative configuration of the VBG-based embodiment of the present invention, where the FIG. 10 alternative configuration is particularly designed for use with an optical amplifier. In this configuration, a wavelength division multiplexer (WDM) 70 is disposed in alignment with VBG 54. A separate optical fiber 72 is used to support the propagation of a communication signal that is to be amplified. This communication signal operates at a wavelength different from a pump wavelength (for example, 1550 nm) provided by source 50. WDM 70 is configured to reflect the signal wavelength and pass the pump wavelength. In this manner, the incoming communication signal passes through VBG 54 unimpeded and is then re-directed by WDM 70 to be coupled into the same output fiber 58 used to support the propagating (wavelength-stabilized) pump light. Thus, this compact arrangement allows for the presentation of both the signal and pump light to a doped section fiber where the amplification is to be performed.

The invention has been described herein in terms of preferred embodiments. Other embodiments of the invention, including alternatives, modifications, and equivalents of the embodiments described herein, will be apparent to those skilled in the art from consideration of the specification and drawings. The embodiments and preferred features described above should be considered as exemplary only, with the invention being defined by the claims appended hereto, which therefore include all such alternatives, modifications, and equivalents as fall within the true spirit and scope of the present invention.

What is claimed is:

1. A small form-factor, wavelength-stabilized packaged laser comprising
    a housing formed in compliance with small form-factor requirements;
    a submount disposed within the housing;
    a specialty gain element disposed on the submount, the specialty gain element including a curved optical waveguide configured such that a front facet is non-parallel with a rear facet, the rear facet defining a first mirror of a laser cavity along an optical axis through the curved optical waveguide, the specialty gain element energized to generate optical radiation;
    a partially-reflective wavelength stabilization component disposed in close proximity to the front facet of the specialty semiconductor gain element and positioned in optical alignment with the rear facet to form a second mirror of the laser cavity, and also functioning as an optical filter to stabilize the output wavelength of the generated optical radiation; and
    an optical output fiber coupled at an endface termination to the specialty gain element and disposed to exit through a sidewall aperture of the housing, the endface termination of the optical output fiber attached to the submount at a first fixing point and affixed within the sidewall aperture at a second fixing point, defining a section of optical output fiber disposed within the small form factor package between the first and second fixing points.

2. The small form-factor, wavelength-stabilized packaged laser as defined in claim 1 wherein the partially-reflective, wavelength-selective filtering component comprises a fiber Bragg grating (FBG) formed in a portion of the section of output optical fiber in close proximity to the front facet of the specialty gain element between the first and second fixing points.

3. The small form-factor, wavelength-stabilized packaged laser as defined in claim 2 wherein the FBG is disposed within a distance no greater than 4 mm from the front facet.

4. The small form-factor, wavelength-stabilized packaged laser as defined in claim 1 wherein the section of optical output fiber within the package is formed to have a length sufficient to include a slight bend between the first and second fixing points for accommodating changes in stress.

5. The small form-factor, wavelength-stabilized packaged laser as defined in claim 1 wherein the wavelength-selective filtering component comprises a discrete component volume Bragg grating (VBG) disposed at a predetermined location on the submount so as form the second laser cavity mirror in alignment with the rear facet of the specialty gain element.

6. The small form-factor, wavelength-stabilized packaged laser as defined in claim 1 wherein the packaged laser further comprises
    an incoming optical fiber supporting the propagating of a signal at a predetermined wavelength; and
    a wavelength division multiplexer disposed on the submount and aligned with the incoming optical fiber and output optical fiber such that the incoming signal is re-directed into the output optical fiber to co-propagating with the wavelength-stabilized laser output.

7. The small form-factor, wavelength-stabilized packaged laser as defined in claim 6 wherein the packaged laser generates a pump beam at a stabilized output wavelength, providing both an optical signal and related, stabilized pump beam as outputs for use by an optical amplifier.

* * * * *